United States Patent
Lejon

(10) Patent No.: US 7,902,921 B2
(45) Date of Patent: Mar. 8, 2011

(54) OUTPUT NETWORKS IN COMBINATION WITH LINC TECHNIQUE

(75) Inventor: Thomas Lejon, Vallentuna (SE)

(73) Assignee: Telefonaktiebolaget L M Ericsson (PUBL), Stockholm (SE)

( * ) Notice: Subject to any disclaimer, the term of this patent is extended or adjusted under 35 U.S.C. 154(b) by 0 days.

(21) Appl. No.: 12/857,673

(22) Filed: Aug. 17, 2010

(65) Prior Publication Data

US 2010/0301933 A1 Dec. 2, 2010

Related U.S. Application Data

(62) Division of application No. 12/297,994, filed as application No. PCT/SE2006/050083 on Apr. 21, 2006, now Pat. No. 7,800,442.

(51) Int. Cl.
*H03F 3/68* (2006.01)
(52) U.S. Cl. .................................... 330/124 R; 330/295
(58) Field of Classification Search .............. 330/124 R, 330/295, 84, 126
See application file for complete search history.

(56) References Cited

U.S. PATENT DOCUMENTS

| 5,025,225 A | * | 6/1991 | Tajima et al. | ............. 330/124 D |
| 7,332,960 B2 | * | 2/2008 | Burns et al. | ............. 330/124 R |
| 7,358,806 B2 | * | 4/2008 | Burns et al. | ............. 330/124 R |
| 2006/0006934 A1 | | 1/2006 | Burns et al. | |

FOREIGN PATENT DOCUMENTS

| JP | H11-017466 A | 1/1999 |
| JP | 2001-053520 A | 2/2001 |

OTHER PUBLICATIONS

U.S. Appl. No. 12/297,994, filed Apr. 23, 2009, All references in parent application.

* cited by examiner

*Primary Examiner* — Henry K Choe
(74) *Attorney, Agent, or Firm* — Roger S. Burleigh

(57) ABSTRACT

The present invention relates to balanced power amplifier network in combination with outphasing techniques such as Chireix. The object of the present invention is to provide a solution to the problem to combine balanced amplifiers like the current mode class D (CMCD) or class E/F with a LINC network. The main problem is that some power amplifiers have balanced output and the LINC network is single-ended so that a high power low loss transformer that works at several impedance levels is needed, which is hard to realize at cellular frequencies.

3 Claims, 6 Drawing Sheets

US 7,902,921 B2

OUTPUT NETWORKS IN COMBINATION WITH LINC TECHNIQUE

CROSS-REFERENCE TO RELATED APPLICATIONS

This application is a divisional of U.S. application Ser. No. 12/297,994, filed Oct. 21, 2008, now U.S. Pat. No. 7,800,442, which was the National Stage of International Application No. PCT/SE2006/050083, filed Apr. 21, 2006, the disclosure of which is incorporated herein by reference.

TECHNICAL FIELD

The present invention relates to a balanced amplifier network in combination with outphasing technique.

BACKGROUND OF THE INVENTION

In radio transmitters for broadcast, cellular and satellite, systems the power amplifier in the transmitter has to be very linear in addition to being able to simultaneously amplify many radio channels (i.e. frequencies) spread across a wide bandwidth. High linearity is required since nonlinear amplifiers would cause leakage of interfering signal energy between channels and distortion within each channel.

In radio transmitter stations for cellular systems, amplifiers in class A and B have been suggested for use in combination with LINC (LINC, Linear Amplification using Nonlinear Components) or Chireix outphasing methods providing high linearity and efficiency, and wide bandwidth.

The outphasing method, which will be described in more detail in FIG. 1, resolves an envelope-modulated bandpass waveform $s_{in}$ in a signal component separator into two out-phased constant envelope signals $s_1$ and $s_2$, which are applied to power amplifiers. The outputs of the power amplifiers are combined in a hybrid arrangement recovering the envelope-modulated waveform. The output amplitude of the amplified outsignal $s_{out}$ is a result of the phase shift between the signals $s_1$ and $s_2$. When the signals are in phase amplitude maximum is achieved and when in anti-phase a minimum amplitude is achieved. The hybrid is constructed in order for the amplifier to see an impedance load. Hence, the efficiency ratio will be reciprocally proportional to the ratio between peak power and mean power. By replacing the impedance load by a compensating reactance network, known as the Chireix method, the region of high efficiency is extended to include lower output power levels.

LINC and Chireix networks are sensitive systems that fit well with unbalanced amplifier like unbalanced class A, B, C, E and F amplifiers.

Documents WO2004/023647 and WO2004/057755 describe composite amplifier structures comprising several Chireix pairs of unbalanced power amplifiers for use in radio terminals such as mobile radio terminals and base stations.

A current-mode class-D power amplifier achieving high efficiency at radio frequencies is described in "Current-Mode Class-D Power Amplifiers for High-Efficiency RF Applications", IEEE Transactions on Microwave Theory and Techniques, vol. 49, no 12, December 2001, pp. 2480-2485. However, due to new progress in semiconductor electronics, especially production methods of integrated circuits in Gallium Nitride (GaN) techniques, it has been interesting to use balanced class B, E/F and current mode class D (CMCD) amplifiers instead. Said amplifiers are non-linear, but provide high efficiency.

No specific solution exists as to combine balanced amplifiers like the CMCD or class E/F with a LINC network. The main problem is that the CMCD amplifier and class E/F have a balanced output and the LINC network is single-ended so that a high power low loss transformer that works at several impedance levels is needed, which is hard to realize at cellular frequencies.

BRIEF DESCRIPTION OF THE INVENTION

An object of the present invention is to provide a balanced power amplifier network in combination with a LINC or Chireix outphasing technique.

The above object is achieved by a composite power amplifying system presented in the independent claims 1 and 4.

A radio terminal according to the invention is stated in the independent claim 7.

Preferred embodiments of the invention are defined in the dependent claims.

One advantage with the present invention is that the use of said amplifiers, which are balanced, in combination with a LINC or Chireix outphasing method results in high linearity and wide bandwidth.

BRIEF DESCRIPTION OF THE DRAWINGS

The invention will in the following be described in more detail with reference to enclosed drawings, wherein.

DETAILED DESCRIPTION OF THE INVENTION

Figure 1:
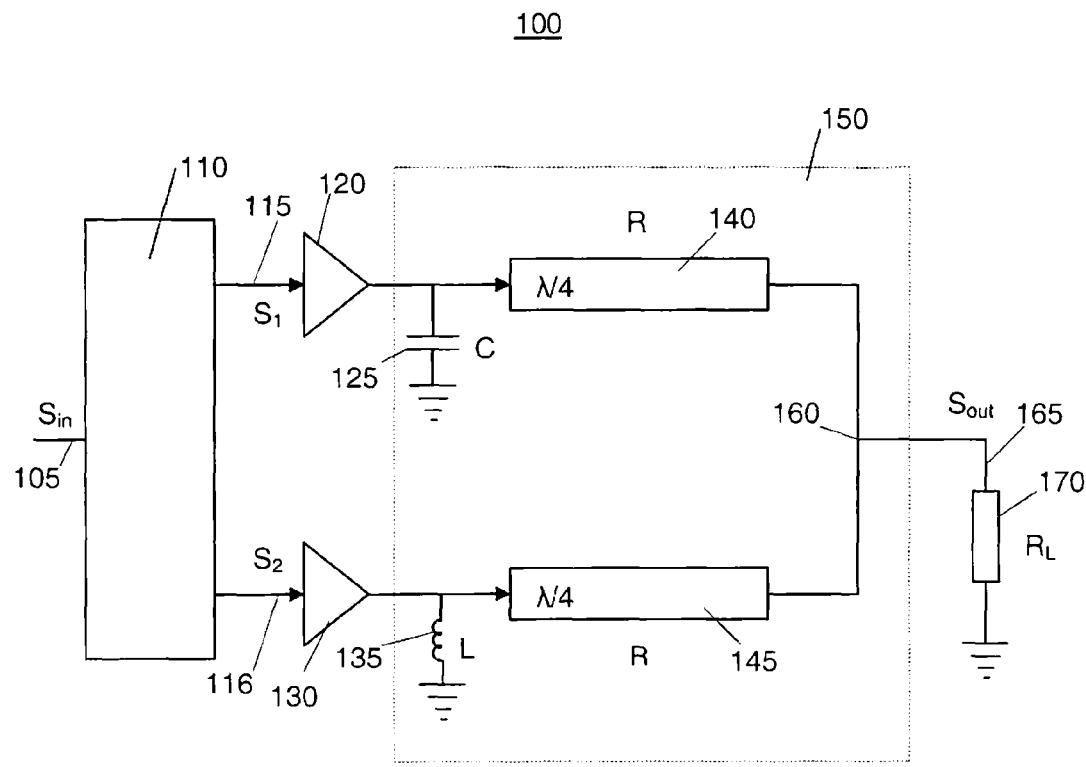
FIG. 1 is a block diagram of a typical prior art Chireix outphasing amplifying system.

FIG. 1 is a block diagram of a typical prior art outphasing amplifier system 100, i.e. a Chireix amplifier. A signal $s_{in}$ is connected via an input 105 to a signal component separator (SCS) 110, which comprises two outputs 115 and 116. The signal strength of $s_{in}$ will be represented as a phase difference between the two output signals $s_1$ and $s_2$ on the outputs 115 and 116, respectively. Each output is connected to a power amplifier 120 and 130, respectively, as shown in the figure. The amplifiers 120, 130, are typical of any type of unbalanced amplifiers of class B. Hence, two out-phased constant envelope signals $s_1$ and $s_2$ are resolved from an envelope-modulated bandpass waveform $s_{in}$ in a signal component separator 110. The outputs of the power amplifiers are combined to form an amplified linear signal in a Chireix type output network. The phase difference of these constant-amplitude out-phased signals are determined by the SCS 110 so that the result from their vector-summation yields the desired amplitude of the output signal $s_{out}$.

As shown in FIG. 1, the amplifiers 120, 130 are connected to an output combination network 150, including two transmission lines 140, 145 (one line for each amplifier) with electrical length ☐☐☐ and impedance R, where ☐☐ denotes the wavelength of the center frequency of the frequency band at which the amplifier is operated. R is the chosen output impedance for the amplifier providing maximum power efficiency. In addition, the network comprises two compensating reactances, a capacitor C 125 and an inductor L 135, which are used to extend the region of high efficiency to include lower output levels. Said transmission lines are connected in a connection point 160 from which an output 165 conducts the resulting outsignal $s_{out}$ to a load $R_L$ 170. The transformed antenna impedance $R_L$ (170) equals the parallel connection of the optimal loads of all amplifiers, i.e. $R_L$=R/2.

An appropriate combination, network for the Chireix amplifying system not only reinserts the amplitude modulation to the signal, it also provides a dynamic adjustment of the impedance presented to each amplifier (outphasing). This outphasing adjustment of the impedances is such that the DC current through each active device decreases as the combined output amplitude decreases, thereby maintaining high efficiency.

An advantage of the Chireix amplifying system is the ability to change the efficiency curve to suit different peak-to-average power ratios, by changing the size of the reactances.

As mention new semiconductor techniques provide amplifiers of class B, E/F and CMCD with high efficiency at radio, frequencies. The problem with class B, E/F and CMCD amplifiers is that they are balanced.

Figure 2:
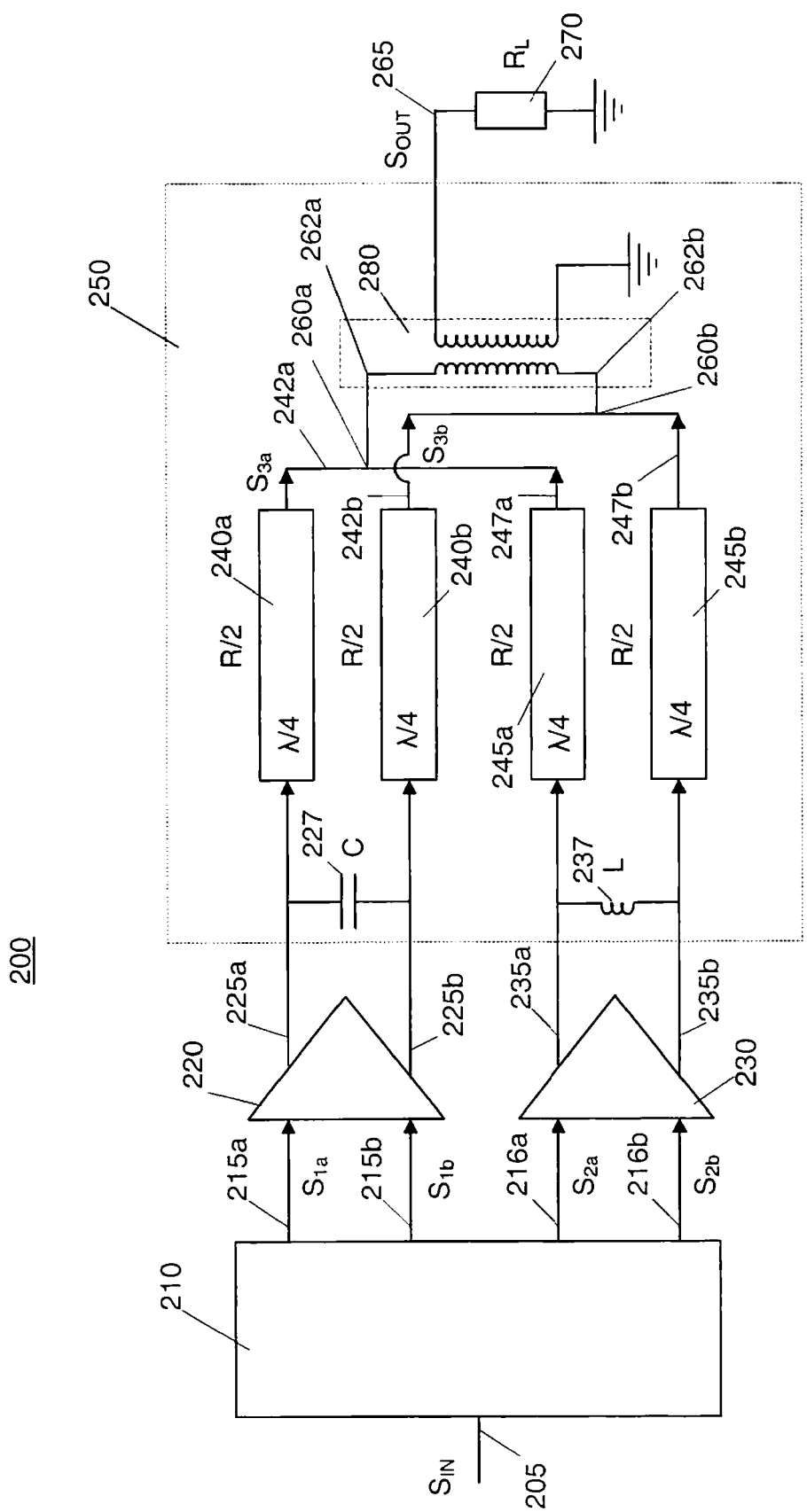
FIG. 2 shows a block diagram of a preferred embodiment of a Chireix outphasing amplifying system with balanced amplifiers and a balanced lossless output combination network.

FIG. 2 shows a block diagram of a preferred embodiment of a Chireix outphasing amplifying system 200 with balanced amplifiers 220, 230 and a balanced lossless output combination network 250. A signal $s_{in}$ is connected via an input 205 to a signal component separator 210, which comprises four outputs 215a, 215b, 216a and 216b. The signal strength of $s_{in}$ will be represented as a phase difference between the four output signals $s_{1a}$, $s_{1b}$, $s_{2a}$ and $s_{2b}$ b on the outputs 215a, 215b, 216a and 216b, respectively. Outputs 215a and 215b are connected to a first power amplifier 220 and outputs 216a and 216b are connected to a second power amplifier 230, as shown in the figure. The amplifiers 220, 230, could be of any type of balanced amplifiers of class B, E/F and CMCD. Hence, four out-phased constant envelope signals $s_{1a}$, $s_{1b}$, $s_{2a}$, $s_{2b}$ are resolved from an envelope-modulated bandpass waveform $s_{in}$ in a signal component separator 110. The first and second outputs 225a, 225b of the first power amplifier and the first and second outputs 235a, 235b of the second power amplifier are combined to form an amplified linear signal in a balanced loss-less output combination network 250 without distorting the systems ability to change the efficiency curve to suit different peak-to-average power ratios.

As shown in FIG. 2, the amplifiers 220, 230 are connected to an output combination network 250, including four transmission lines 240a, 240b, 245a and 245b (two lines for each amplifier) with electrical length ☐☐☐ on and impedance R/2, where ☐☐ denotes the wavelength of the center frequency of the frequency band at which the amplifier is operated. R is the chosen output impedance for the amplifier providing maximum power efficiency. In addition, the network comprises two compensating reactances, a capacitor C 227 and an inductor L 237, which are used to extend the region of high efficiency to include lower output levels. The first transmission line 240a and the third transmission line 245a are connected to a first connection point 260a, whereto the processed signal $s_{3a}$, is outputted. Similarly, the second transmission line 240b and fourth transmission line 245b are connected to a second connection point 260b, whereto the processed signal $s_{1b}$ is outputted. The connection points 260a and 260b are connected via a first input 262a and a second input 262b to a balun arrangement 280 with two input terminals. The balun arrangement converts from balanced to unbalanced operation and outputs via conductor 265 the resulting outsignal $s_{out}$, where $s_{out}$ equals $s_{3a}$-$s_{3b}$, to a load $R_L$ 270. The transformed antenna impedance $R_L$ equals the parallel connection of the optimal loads of all, amplifiers, i.e. $R_L$=R/2.

Another way of implementing the output networks of the Chireix outphasing network are by using transmission lines only. In such a distributed implementation the reactance and quarter wave combination is replaced by shortened and lengthened transmission lines. Instead of the capacitor (227) a lengthened transmission line could be used and instead of the inductor (237) a shortened transmission line could be used.

The connection points 260a and 260b situated after the four transmission lines provide the possibility to connect a balun arrangement at the output load. The configuration enables the use of standard balun arrangements like a transformer coupling such as the hybrid ring when converting from balanced to unbalanced, i.e. single-ended, operation. A narrow-band balun device could be used. It doesn't have any impact on the amplifiers load. Connecting the balun arrangement at the connection points 260a and 260b implies that the systems ability to change the efficiency curve to suit different peak-to-average power ratios is preserved, providing high linearity and efficiency, and wide bandwidth.

Figure 3:
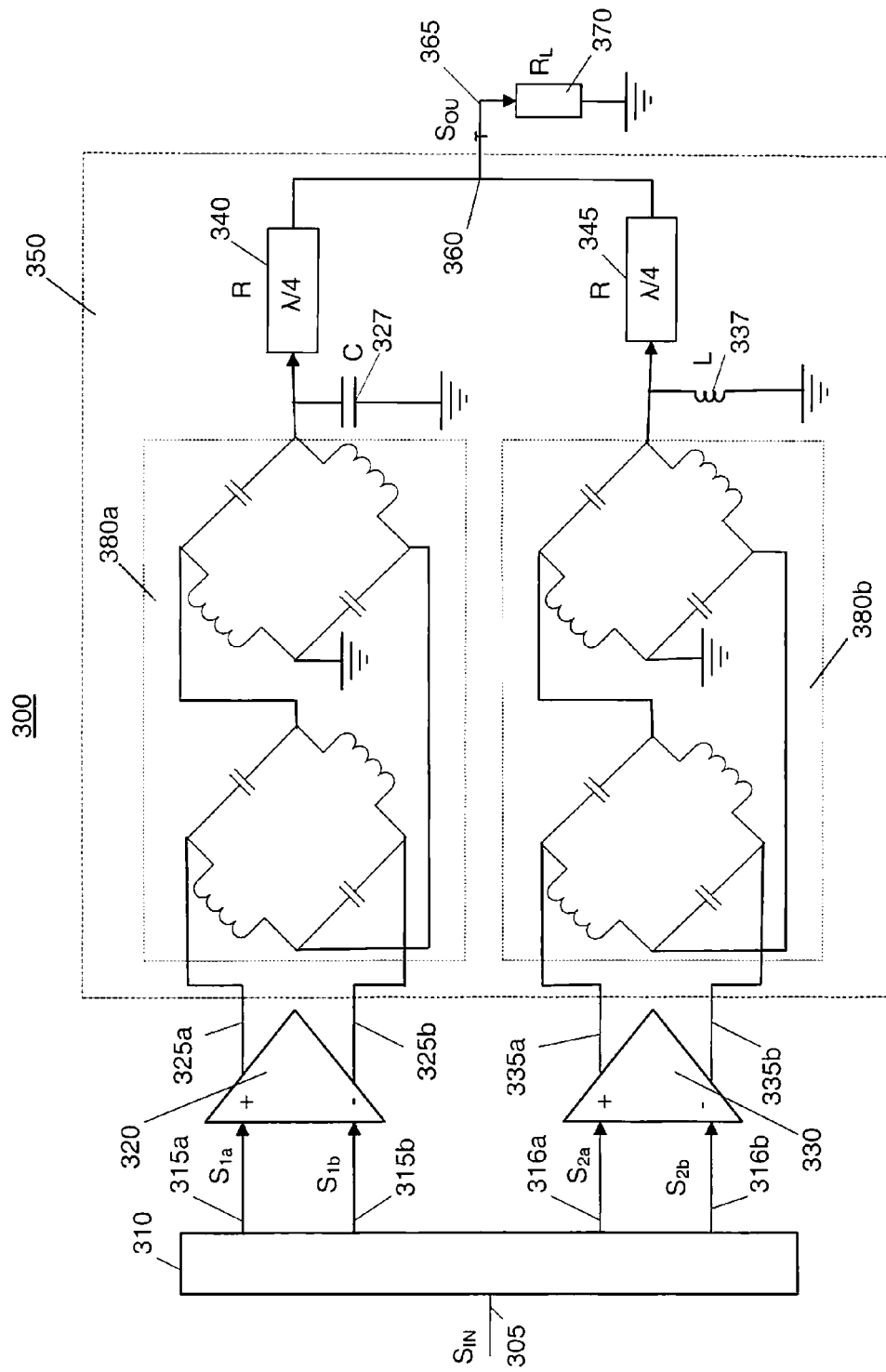
FIG. 3 shows a block diagram of another preferred embodiment of a Chireix outphasing amplifying system with balanced amplifiers.

FIG. 3 shows a block diagram of another preferred embodiment of a Chireix outphasing amplifying system 300 with balanced power amplifiers 320, 330 and a balanced lossless output combination network 350. A signal $s_{in}$ is connected via an input 305 to a signal component separator 310, which comprises four outputs 315a, 315b, 316a and 316b. The signal strength of $s_{in}$ will be represented as a phase difference between the four output signals $s_{1a}$, $s_{1b}$, $s_{2a}$ and $s_{2b}$ on the outputs 315a, 315b, 316a and 316b, respectively. Outputs 315a and 315b are connected to a first power amplifier 320 and outputs 316a and 316b are connected to a second power amplifier 330, as shown in the figure. The amplifiers 320, 330, could be of any type of balanced amplifiers of class B, E/F and CMCD. Hence, four out-phased constant envelope signals $s_{1a}$, $s_{1b}$, $s_{2a}$, $s_{2b}$ are resolved from an envelope-modulated bandpass waveform $s_{in}$ in a signal component separator 310. The first output 325a and the second output 325b of the first power amplifier 320 and the first output 335a and the second output 335b of the second power amplifier are combined to form an amplified linear signal in a balanced lossless output combination network 350 without distorting the systems ability to change the efficiency curve to suit different peak-to-average power ratios.

Figure 4:
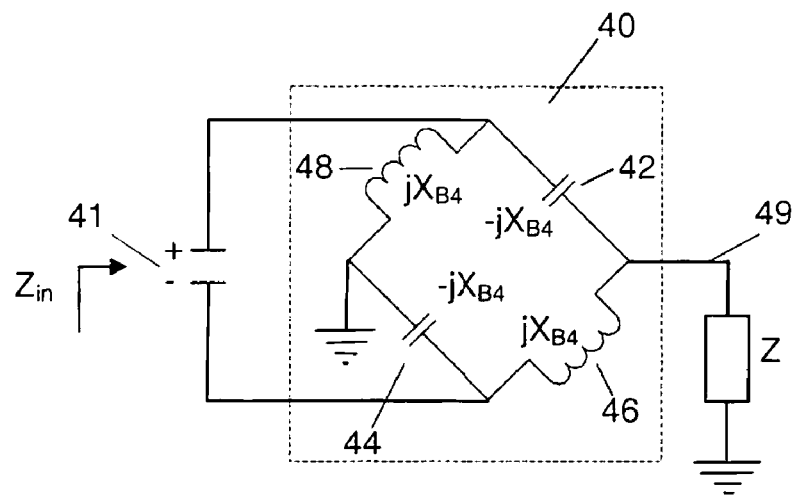
FIG. 4 shows a Lumped-element balun device.
Figure 5:
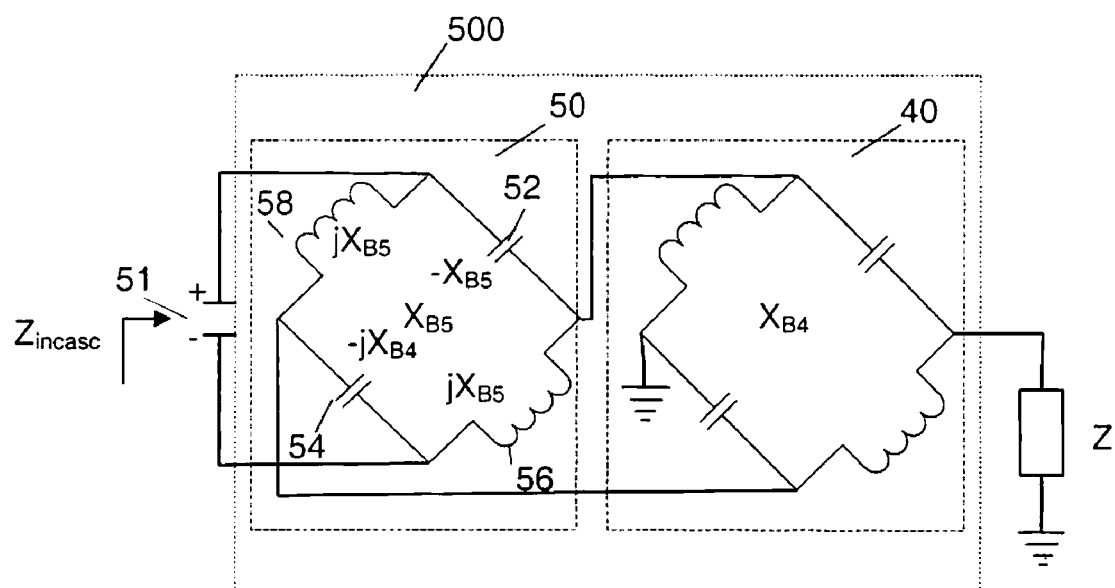
FIG. 5 shows a two cascaded Lumped-elements balun arrangement.

As shown in FIG. 3, the amplifiers 320, 330 are connected to an output combination network 350, including two balun arrangements 380a and 380b, which will be further described in connection to FIGS. 4 and 5, and two transmission lines 340, 345 with electrical length ☐☐☐ and impedance R, where ☐☐ denotes the wavelength of the center frequency of the frequency band at which the amplifier is operated. Furthermore, R is the chosen output impedance for the amplifier providing maximum power efficiency. Said transmission lines are connected in a connection point 360 from which an output 365 conducts the resulting outsignal $s_{out}$ to a load $R_L$ 370.

Hereinafter, the principle of the function of the balun arrangement 380 will be described in more detail with reference to FIGS. 4 and 5.

A balun device is designed to have a precise 180-degree phase shift, with minimum loss and equal balanced impedances. FIG. 4 shows a Lumped-element balun device 40. The balun device 40 is essentially a bridge and consists of four elements, of which two are capacitors $-jX_{B4}$ (42, 44) and two are inductors $jX_{B4}$ (46, 48), constructed in a lattice network. If the impedance of each element is chosen to be of the same size, the impedance $Z_{in}$ at the input (41) of the balun device will equal the inverted impedance Z at the output (49) of the balun device. The resulting balun device impedance at the balanced input (41) $Z_{in}$ can be expressed by $$Z_{in} = X_{B4}^2/Z$$

where $X_{B4}$ is the impedance of each element in the balun device 40. Moreover, a second Lumped-element balun device 50, as shown in FIG. 5, is connected to the input of the first Lumped-element balun device 40 forming a two cascaded Lumped-elements balun arrangement 500. The balun device 50 is also essentially a bridge and consists of four elements, of which two are capacitors $-jX_{B5}$ (52, 54) and two are inductors $jX_{B5}$ (56, 58), constructed in a lattice network. If the impedances of each element are chosen to be of the same size, the impedance $Z_{incasc}$ at the input (51) of the balun arrangement will equal the inverted impedance $Z_{in}$ at the input (41) of the balun device 40 as the impedance $Z_{in}$ of the first balun device 40 is inverted by the same principle as described above with reference to FIG. 4 by said second Lumped-element balun device 50. The resulting balun arrangement impedance at the balanced input (51) $Z_{incasc}$ can be expressed by $$Z_{incasc} = X_{B5}^2/X_{B4}^2 \times Z$$

where $X_{B5}$ is the impendence of each element in the second balun device 50. Thus, if $X_{B5}$ equals $X_{B4}$ the cascaded impedance equals the load Z at output of the first balun device 40.

$$Z_{incasc} = Z$$

Furthermore, the power amplifiers 320 and 330, as shown in FIG. 3, are connected to two balun arrangement 380a and 380b with the same function and design as the described balun arrangement 500. That is, the first output (325a) of the first power amplifier (320) is connected to a first input of a first balun arrangement (380a) and the second output (325b) of the first power amplifier (320) is connected to a second input of the first balun arrangement (380a). The first output (335a) of the second power amplifier (330) is connected to a first input of the second balun arrangement (380b), and the second output (335b) of the second power amplifier (330) is connected to a second input of the second balun arrangement (380b). Further, a single-ended output of the first balun arrangement (380a) is connected to the first transmission line (340) and a second single-ended output of the second balun arrangement (380b) is connected to the second transmission line (345). In addition, the network comprises two compensating reactances, a capacitor C 327 and an inductor L 337, which are used to extend the region of high efficiency to include lower output levels. Further, the first and the second transmission lines are connected to a connection point (360) to which the output load $R_L$(370) is connected.

The transformed antenna impedance $R_L$ equals the parallel connection of the optimal loads of all amplifiers, i.e. $R_L = R/2$. In accordance with the described function of the balun arrangement 500 the amplifiers 320, 330 will see the impedance R as the balun arrangement could be arranged to have no impact on the impedance at its output. Thus, the systems ability to change the efficiency curve to suit different peak-to-average power ratios is preserved, providing high linearity and efficiency, and wide bandwidth.

This embodiment is advantageous when integrated on an ASIC.

Similarly as in previous described embodiment, a distributed implementation could be used, i.e. the reactance and quarter wave combination is replaced by shortened and lengthened transmission lines. Instead of the capacitor (327) a lengthened transmission line could be used and instead of the inductor (337) a shortened transmission line could be used.

The present invention also relates to a radio terminal comprising the composite power amplifier system for amplifying a signal to be transmitted via an aerial or antenna device. Said radio terminal may be a mobile radio terminal handset, a base station, or a satellite comprising transceiver or transmitter device(-s)/arrangement for transmitting the power amplified signal over the air interface to a receiving device. In the following FIGS. 6 and 7, different embodiments of radio terminals comprising the invented power amplifier system are schematically illustrated and described.

Figure 6:
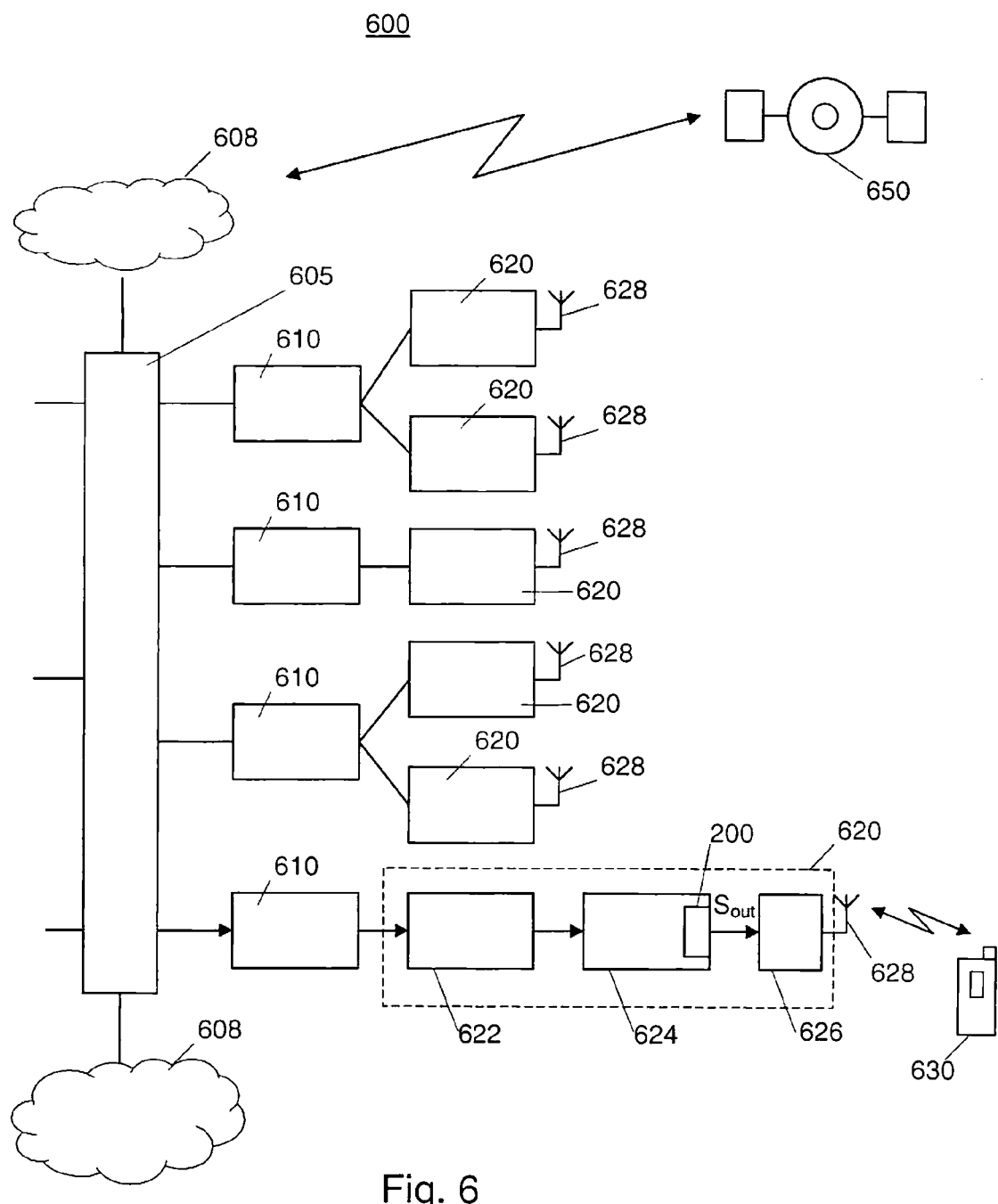
FIG. 6 is a schematic illustration of a WCDMA network architecture comprising base stations, node B, for mobile radio telecommunications.

FIG. 6 is a schematic illustration of a WCDMA network architecture 600 comprising base stations 620, node B. The network comprises a Core network 605 to which a number of Radio Network Controllers 610 (RNC) are connected and other networks 608, e.g. Public Switched Telephony Network (PSTN), Public data Networks, Internet, Integrated Services Digital Network (ISDSN), other Public Land Mobile Networks (PLMN), Satellite telecommunication systems, etc. The RNC 610 controls at least one dedicated node B 620 (Base Station in GSM networks). The RNC 620 controls and handles the uplink and downlink communications over the air interface between a node B 620 (connected to the RNC) and subscriber units, such as radio handset terminals 630. A node B comprises, among other units '8 not shown), Base Band units 622, Radio Units 624, Filter Units 626 and an antenna system 628. The Base Band unit 622 transforms digital messages into I and Q vectors, which are transferred to the Radio Unit 624. In the Radio Unit, said vectors are modulated on carriers resulting in signals $s_{in}$ (see FIGS. 2-6). Before transmission, the signals $s_{in}$ are power amplified. Therefore, the Radio Unit is equipped with at least one composite power amplifier system 200 according to the invention. The amplifier system 200 power amplifies $s_{in}$ and provides an output signal $s_{out}$ to the antenna system 628 for transmission over a radio channel to a subscriber unit 630, e.g. a radio terminal handset.

It is also possible to use the composite power amplifier system 200 according to the invention in a satellite 650 for mobile radio telecommunications. The satellite will then operate as a relay station comprising transmitters and/or transceivers in the Radio Units 624 and antenna systems 628 for handling the communication with a control station in a Satellite telecommunication systems 608 and satellite radio terminals 630 located on the earth.

Figure 7:
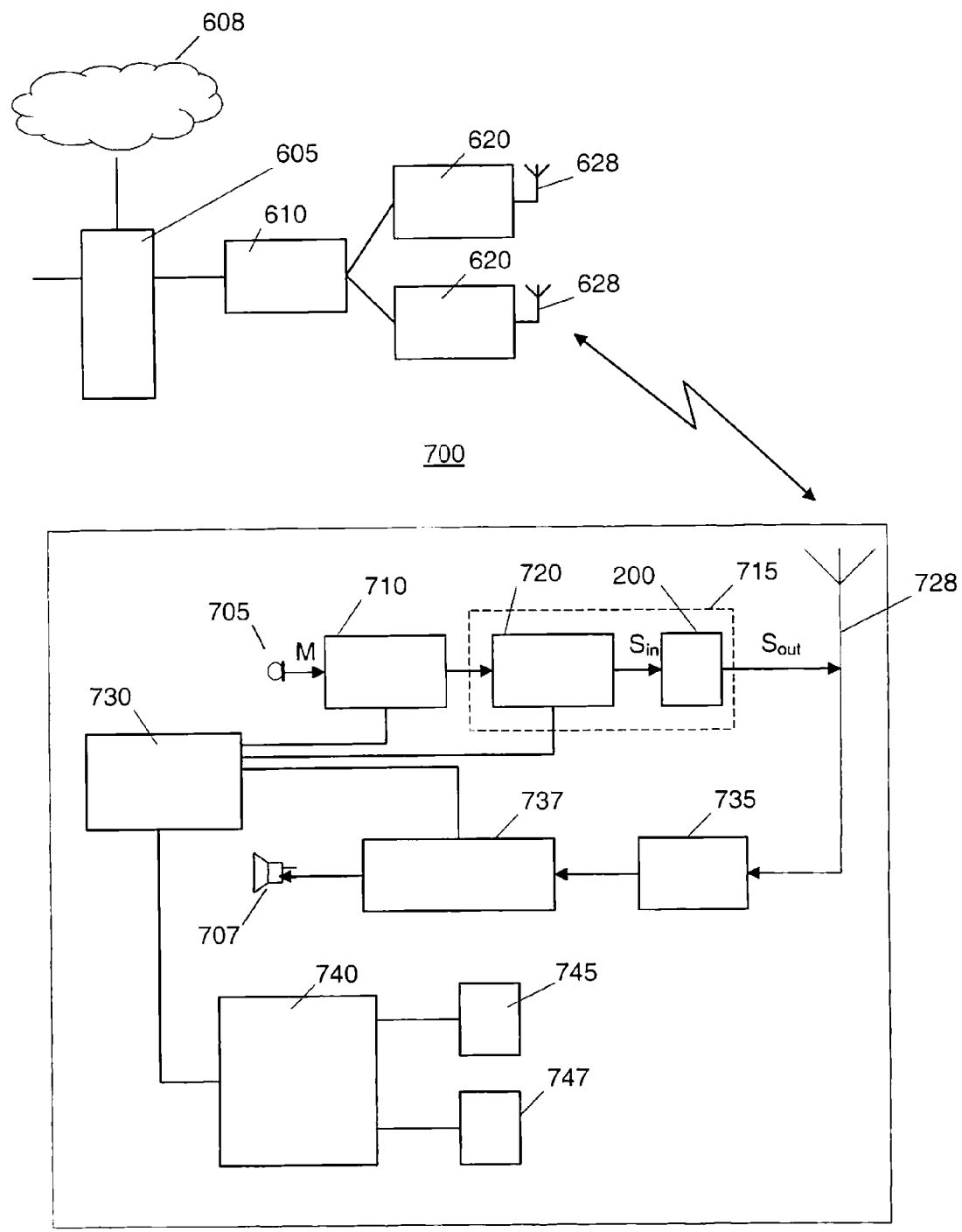
FIG. 7 illustrates schematically a mobile radio terminal for mobile radio telecommunications.

FIG. 7 illustrates schematically a mobile radio terminal, also denoted handset, 700 for mobile radio telecommunications. The terminal comprises a microphone 705 for transforming voice and audio to an electrical signal M(t). Said signal M(t) is processed before being modulated and power amplified by a first signal processing block 710 comprising ND-converter unit, Speech and channel coder units, and digital formatting devices for arranging the signal into a suitable transmitting format for mobile radio telecommunication systems like GSM/(EDGE) GPRS UMTS (WCDMA), och CDMA-systems. In the transmitter 715, or Radio Unit 720, the processed signal $s_{in}$, which is generated by the block 710, is modulated in a modulator (not shown) and thereafter power amplified by the composite power amplifier system 200 according to the present invention, generating an output signal $s_{out}$, which is transmitted via the aerial/antenna 728 to a base station 620 in a telecommunication network 600 (see FIG. 6). Preferably, a filter arrangement (not shown) is also inserted between the amplifier system and the antenna.

Said terminal 700 also comprises at least one controller 730, such as a microprocessor or central processing unit, for controlling the units of the terminal by using stored, readable and executable software.

Further, the terminal 700 comprises a receiving unit 735 connected to the antenna 728 for receiving transmitted signals and transform them in a second signal processing block 737. If the received signal contains voice, the voice signal is decoded by decoder units and converted by a D/A—converter to an audio signal before being transformed to sound by a loudspeaker 707. The terminal comprises a keyboard 745, a display 747 and a Man-Machine-Interface block (MMI) 740 that allows a user to interactively control the terminal, write and read text messages, initiate telephone calls, etc.

As obvious to person skilled in the art, the radio terminal may also comprise a number of other blocks and units that provides other services and functions, e.g. Short Message Service (SMS), Multi Media Service (MMS), etc. Said units, which have been chosen to not be illustrated in FIG. 7 for reasons of simplifying the presentation of a terminal according to the present invention, generate digital information signal that are possible to power amplify using the invented composite power amplifier system.

The present embodiments have been described as Chireix outphasing circuits or networks. However, any other LINC technique may be applicable as realized by a person skilled in the art.

The present invention may be embodied in many different forms and should not be construed as limited to the embodiments set forth herein; rather, these embodiments are provided so that this disclosure will be thorough and complete, and will fully convey the scope of the invention as defined by the enclosed set of claims.

What is claimed:

1. A composite power amplifying system for amplifying a signal according to Linear Amplification using Nonlinear Components (LINC) or Chireix outphasing techniques, comprising:

two balanced power amplifiers, each having two outputs, wherein a first output of the first power amplifier is connected to a first transmission line and the first output of the second power amplifier is connected to a third transmission line, and a second output of the first power amplifier is connected to a second transmission line and the second output of the second power amplifier is connected to a fourth transmission line, wherein the first and the third transmission lines are connected to a first connection point and the second and fourth transmission lines are connected to a second connection point, said first connection point is connected to a first input of a balun arrangement and the second connection point is connected to a second input of the balun arrangement, wherein one of the outputs of the balun arrangement is connected to an output load.

2. The amplifying system of claim 1, wherein said power amplifiers are any of class B, E/F or current mode class D power amplifiers.

3. The amplifying system according to claim 1, wherein the balun arrangement is a hybrid ring.

* * * * *

UNITED STATES PATENT AND TRADEMARK OFFICE
CERTIFICATE OF CORRECTION

| | |
|---|---|
| PATENT NO. | : 7,902,921 B2 |
| APPLICATION NO. | : 12/857673 |
| DATED | : March 8, 2011 |
| INVENTOR(S) | : Lejon |

It is certified that error appears in the above-identified patent and that said Letters Patent is hereby corrected as shown below:

In Fig. 3, Sheet 3 of 6, before Tag "365", delete "$S_{OU}$" and insert -- $S_{out}$ --, therefor.

In Column 1, Line 21, delete "satellite," and insert -- satellite --, therefor.

In Column 3, Line 16, delete "combination," and insert -- combination --, therefor.

In Column 3, Line 28, delete "radio," and insert -- radio --, therefor.

In Column 3, Line 38, delete "$s_{2b}$ b" and insert -- $s_{2b}$ --, therefor.

In Column 3, Line 56, delete "on and" and insert -- and --, therefor.

In Column 4, Line 2, delete "$s_{1b}$" and insert -- $s_{3b}$ --, therefor.

In Column 4, Line 9, delete "all," and insert -- all --, therefor.

In Column 6, Line 28, delete "(ISDSN)," and insert -- (ISDN), --, therefor.

In Column 6, Line 62, delete "ND-converter" and insert -- A/D-converter --, therefor.

In Column 6, Line 65, delete "GPRS" and insert -- GPRS, --, therefor.

In Column 6, Line 65, delete "(WCDMA), och" and insert -- (WCDMA), or --, therefor.

Signed and Sealed this
Eighth Day of November, 2011

David J. Kappos
*Director of the United States Patent and Trademark Office*